US006933661B2

United States Patent
Seeley et al.

(10) Patent No.: US 6,933,661 B2
(45) Date of Patent: Aug. 23, 2005

(54) SELF COOLING PIEZO ACTUATOR FOR HIGH TEMPERATURE APPLICATIONS

(75) Inventors: Charles E. Seeley, Niskayuna, NY (US); Todd G. Wetzel, Niskayuna, NY (US); Andrew J. Calver, Clifton Park, NY (US); Jeffrey B. Fortin, Niskayuna, NY (US); Keith B. Fosen, Orlando, FL (US)

(73) Assignee: Lockheed Martin Corporation, Bethesda, MD (US)

( * ) Notice: Subject to any disclaimer, the term of this patent is extended or adjusted under 35 U.S.C. 154(b) by 308 days.

(21) Appl. No.: 10/271,454

(22) Filed: Oct. 16, 2002

(65) Prior Publication Data

US 2004/0140738 A1 Jul. 22, 2004

(51) Int. Cl.⁷ .............................................. H01L 41/08
(52) U.S. Cl. ...................................... 310/341; 310/346
(58) Field of Search ................................ 310/341, 346

(56) References Cited

U.S. PATENT DOCUMENTS 2,840,730 A * 6/1958 Jacke .......................... 310/315

3,536,939 A * 10/1970 Zeiringer .................... 310/329
2002/0043895 A1 * 4/2002 Richards et al. ............ 310/328

* cited by examiner

Primary Examiner—Thomas M. Dougherty
(74) Attorney, Agent, or Firm—Scully, Scott, Murphy & Presser

(57) ABSTRACT

A piezoelectric actuator and a method of assembling and employing a piezoelectric actuator. This method comprises the steps of positioning an expandable piezoelectric material inside a case, and enclosing a vaporizable liquid in the case. The case is positioned in a high temperature environment; and the liquid vaporizes, in that high temperature environment, over a given period of time, to maintain the temperature of the piezoelectric material below a given value for said period of time. Preferably, the vaporizing liquid maintains the temperature of the piezoelectric material substantially constant over that period of time. Also, preferably the case is provided with a pressure responsive valve that opens and closes, in the high temperature environment, to expose the liquid to that environment and control the vaporization of the liquid to maintain the temperature of the piezoelectric material substantially constant over the period of time.

16 Claims, 1 Drawing Sheet

US 6,933,661 B2

SELF COOLING PIEZO ACTUATOR FOR HIGH TEMPERATURE APPLICATIONS

BACKGROUND OF THE INVENTION

Field of the Invention

This invention generally relates to piezoelectric actuators, and more specifically, the invention relates to piezoelectric actuators for high temperature applications.

Propulsion systems, such as jet engines and rocket motors, operate at temperatures often exceeding 1000° C. and at high pressures. There is a need to drive machinery, such as valves and positioning devices, inside such systems that is exposed to these harsh conditions. In some cases, these actuation devices only need to work a few seconds before the requirements of their operational lives have been met.

Previous solutions to providing actuation at high temperatures include complex designs that isolate fragile components from the hot gas. Other designs are based on heavy and inefficient electromagnetic devices such as solenoids and magnets.

Piezoelectric materials, which change shape as a result of an applied voltage, are useful for different types of actuators. However, piezoelectric materials lose their electromechanical properties at temperatures above 250° C. Because of this, heretofore, piezoelectric materials have not been considered well suited for use in applications above that temperature.

SUMMARY OF THE INVENTION

An object of this invention is to provide an improved actuator.

Another object of the present invention is to provide a high temperature actuator having a simple design.

A further object of the invention is to provide a high temperature piezoelectric actuator that can operate in a very harsh environment.

Another object of this invention is to use the phase change properties of a liquid to keep a piezoelectric actuator cool, even in a very hot and harsh environment.

These and other objectives are attained with a piezoelectric actuator and a method of assembling and employing a piezoelectric actuator. This method comprises the steps of positioning an expandable piezoelectric material inside a case, and enclosing a vaporizable liquid in the case. The case is positioned in a high temperature environment; and, at a defined time, the liquid vaporizes, over a given period of time and in a controlled manner, to maintain the temperature of the piezoelectric material below a given value for that period of time. Preferably, the vaporizing liquid maintains the temperature of the piezoelectric material substantially constant over that period of time. Also, preferably the case is provided with a pressure responsive valve that opens and closes, in the high temperature environment and in accordance with a defined procedure, to expose the liquid to that environment and to control the vaporization of the liquid to maintain the temperature of the piezoelectric material substantially constant over the period of time.

As will be understood by those of ordinary skill in the art, a phase change from liquid to gas is characterized by a thermodynamic property known as the heat of vaporization constant, which is unique to all liquids. This quantity indicates the highest temperature a liquid will remain a liquid, at a given pressure, until it boils off and turns into a gas. This thermodynamic property of liquids is employed in a unique manner in the present invention to keep the piezoelectric material at a specific temperature inside its enclosure, even when the surrounding temperature is much hotter.

Further benefits and advantages of the invention will become apparent from a consideration of the following detailed description, given with reference to the accompanying drawing, which specifies and shows a preferred embodiment of the invention.

DETAILED DESCRIPTION OF THE PREFERRED EMBODIMENT

Figure 1:
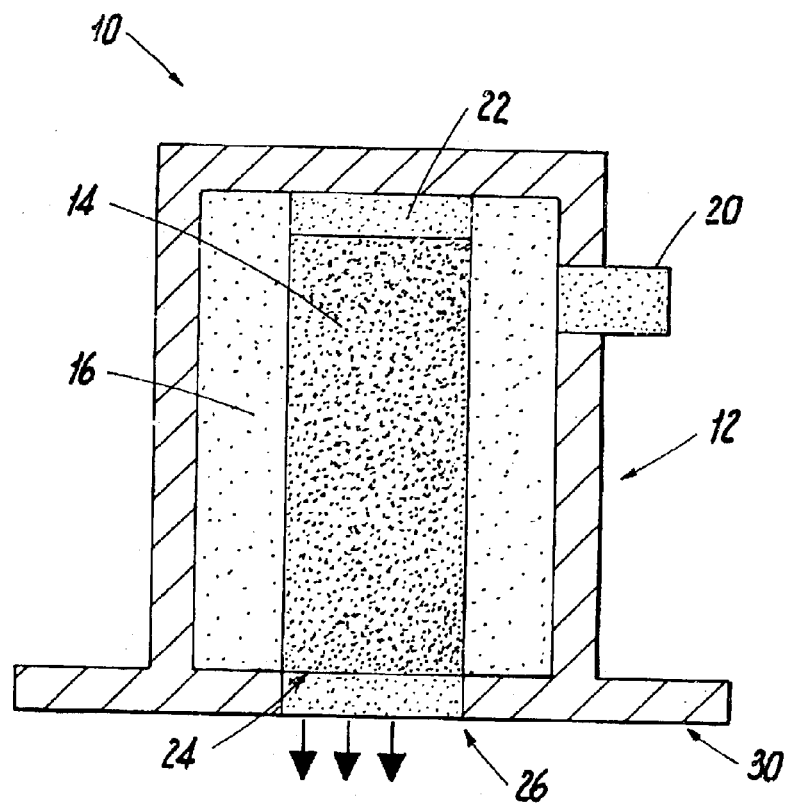
FIG. 1 shows an actuator embodying the present invention
Figure 2:
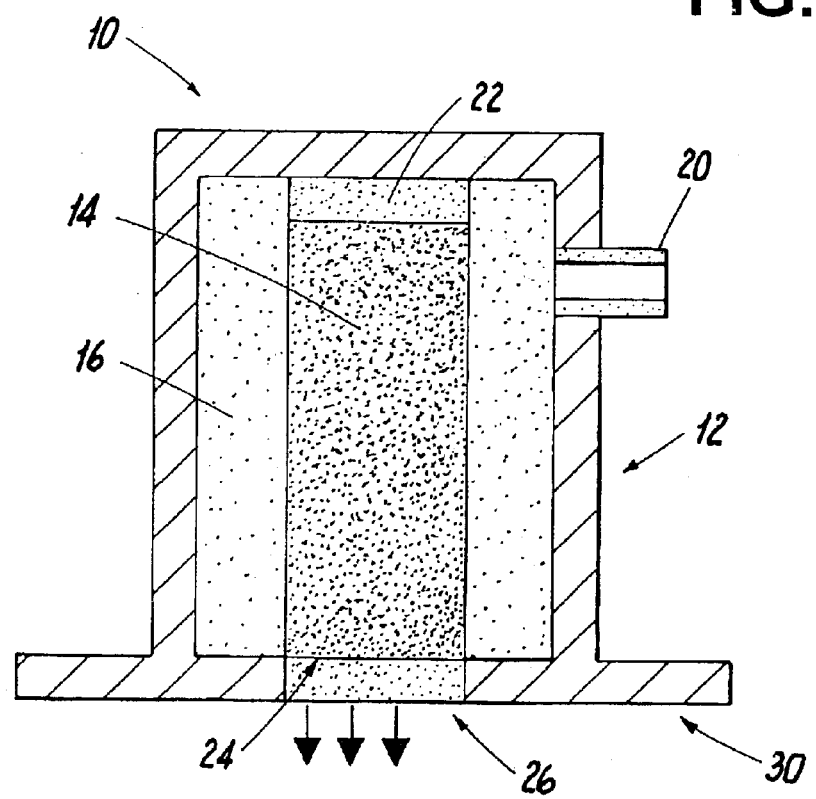
FIG. 2 shows the actuator of FIG. 1 with a valve of the actuator in an open position.

FIGS. 1 and 2 illustrate an actuator 10, generally, comprising a protective case or housing 12, a piezoelectric material 14, a liquid 16, and a valve 20. As shown in the Figures, actuator 10 also includes ceramic spacers 22 and 24, flexible seal 26, and mounting bracket 30. Piezoelectric material is secured inside case 12; and in use, an electric voltage is applied to the piezoelectric material to expand that material. As the material 14 expands, spacer 24 is pushed outwardly, and this outward movement of the spacer may be used, in any suitable way, to control or actuate some other mechanism. For instance, the actuator may be used to change gradually the position of a control valve, or the actuator may be used as a switch to turn a control or guide mechanism on or off.

In order to enable actuator 10 to work in very high temperatures, the piezoelectric material is enclosed within a sealed container, which also contains a liquid 16 with particular thermodynamic properties. When the actuator 10 is inserted into a high temperature environment, such as inside a rocket engine, valve 20 opens, which allows liquid 16 to boil off. This keeps the piezoelectric material 14 at a constant temperature until all of the liquid 16 boils off, even when the ambient temperature is much hotter.

As will be understood by those of ordinary skill in the art, a phase change from liquid to gas is characterized by a thermodynamic property known as the heat of vaporization constant, which is unique to all liquids. This quantity indicates the highest temperature a liquid will remain a liquid, at a given pressure, until it boils off and turns into a gas.

This thermodynamic property of liquids is employed in a unique manner in the present invention to keep the piezoelectric material at a specific temperature inside its enclosure, even when the surrounding temperature is much hotter.

With the preferred embodiment of the invention, the expected operation life of actuator 10 is comparatively short, perhaps several seconds. Also, valve 20 opens at a specific pressure, and the valve opens and closes to maintain that pressure inside the container during operation.

In use, as heat is added to liquid 16, that fluid boils, turns into a gas and escapes through valve 20. The remaining liquid in container 12 stays at the vaporization temperature, thus keeping piezoelectric material 14 at the same temperature, until all the liquid 16 is exhausted.

The specific liquid and operating pressure at which valve 20 opens and closes may be selected over a wide range of values depending on the specific application for the actuator 10. For example, these values may be selected to minimize the temperature rise of the piezoelectric material 14. Also, it may be noted, ceramic spacers 22 and 24 are used, in the preferred embodiment, to minimize heat transfer to the piezoelectric material 14 through conduction. These ceramic materials 22 and 24 are disposed on opposite ends of the piezoelectric material 14, between that material and case 12, on one end, and between the piezoelectric material and seal 26, on the other end.

Seal 26, which extends across one end of case 12, is provided to close that end of the case while allowing expansion of the piezoelectric material 14 against the seal. Mounting bracket 30, which is secured to case 12, may be used to mount actuator 10 in place in the location in which it is used.

As will be understood by those of ordinary skill in the art, any suitable materials may be used for case 12, piezoelectric material 14, valve 20, ceramic spacers 22 and 24, seal 26, and mounting bracket 30. Also, these items may be connected together in any suitable way.

The preferred embodiment of the invention, as described above, provides a number of important advantages. For example, the actuator 10 can be manufactured with less expense than more complex systems that have more parts and materials and that are designed to function in harsh, high temperature environments. A significant weight saving, which is a critical property of any engine used for propulsion, is also a benefit of this invention.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A method of assembling and employing a piezoelectric actuator, comprising the steps of:
    positioning an expandable piezoelectric material inside a case;
    enclosing a vaporizable liquid in the case;
    positioning the case in a high temperature environment; and
    vaporizing the liquid, in the high temperature environment, over a given period of time, to maintain the temperature of the piezoelectric material below a given value for said period of time.

2. A method according to claim 1, wherein the vaporizing step includes the step of vaporizing the liquid to maintain the temperature of the piezoelectric material substantially constant over said period of time.

3. A method according to claim 1, further comprising the steps of:
    providing the case with a pressure valve to open the case at a given pressure; and
    said valve opening, in the high temperature environment, at said given temperature, to expose the liquid to said environment.

4. A method according to claim 1, wherein said high temperature environment has a temperature above 250°.

5. A method according to claim 4, wherein the high temperature environment has a temperature above 1000°.

6. A method according to claim 1, further comprising the steps of:
    securing the piezoelectric material inside the case; and
    positioning ceramic material between the case and the piezoelectric material to insulate the piezoelectric material thermally from the case.

7. A method according to claim 6, wherein:
    the piezoelectric material has first and second ends; and
    the step of positioning the ceramic material includes the steps of
    i) positioning a first ceramic spacer between the case and the first end of the piezoelectric material, and
    ii) positioning a second ceramic spacer between the case and the second end of the piezoelectric material.

8. A method according to claim 1, wherein said period of time is less than ten seconds.

9. A piezoelectric actuator comprising:
    a case;
    a piezoelectric material disposed in the case and expandable between a first position and a second actuating position;
    a liquid disposed in the case; and
    a valve, secured to the case, and having a closed position and an open position, wherein the valve opens at a predetermined condition to expose the liquid in the case to the ambient temperature to vaporize the liquid, over a period of time, to maintain the temperature of the piezoelectric material below a given value for said period of time.

10. A piezoelectric actuator according to claim 9, wherein the liquid vaporizes to maintain the temperature of the piezoelectric material substantially constant for said period of time.

11. A piezoelectric actuator according to claim 9, wherein the valve opens at a predetermined pressure to expose the liquid to said ambient temperature.

12. A piezoelectric actuator according to claim 11, wherein:
    the piezoelectric material includes first and second ends; and
    the piezoelectric actuator further comprises
    i) a first ceramic spacer secured between the case and the first end of the piezoelectric material to insulate thermally said first end from the case, and
    ii) a second ceramic spacer secured between the case and the second end of the piezoelectric material to insulate thermally said second end from the case.

13. A method of employing a piezoelectric actuator, said actuator including a sealed case, an expandable piezoelectric material disposed in the case, and a liquid also disposed in the case, said method comprising the steps of:
    positioning the case in a high temperature environment; and
    vaporizing the liquid, when the case is in the high temperature environment, over a given period of time, to maintain the temperature of the piezoelectric material below a given value for said period of time.

14. A method according to claim 13, wherein the actuator further includes a valve secured to the case to open the case under given conditions, and wherein:
    the vaporizing step includes the step of opening the valve, in the high temperature environment, to expose the liquid in the case to said environment.

15. A method according to claim 14, wherein the step of opening the valve includes the step of opening the valve at a predetermined pressure.

16. A method according to claim 13, wherein the actuator further includes a valve secured to the case, to open the case under given conditions, and wherein:
    the vaporizing step includes the step of selectively opening and closing the valve, during said period of time, to maintain the temperature of the piezoelectric material substantially constant over said period of time.

* * * * *